United States Patent [19]
Bross et al.

[11] Patent Number: 5,517,751
[45] Date of Patent: * May 21, 1996

[54] MULTILAYER MICROELECTRONIC WIRING MODULE AND METHOD FOR FORMING THE SAME

[75] Inventors: Arthur Bross, Poughkeepsie; Robert O. Lussow, Hopewell Junction; Thomas J. Walsh, Poughkeepsie, all of N.Y.

[73] Assignee: International Business Machines Corporation, Armonk, N.Y.

[ * ] Notice: The portion of the term of this patent subsequent to Nov. 9, 2010, has been disclaimed.

[21] Appl. No.: 145,273

[22] Filed: Oct. 29, 1993

Related U.S. Application Data

[62] Division of Ser. No. 863,627, Apr. 3, 1992, Pat. No. 5,259,110.

[51] Int. Cl.⁶ .................................................... H05K 3/36
[52] U.S. Cl. ............................................ 29/830; 174/264
[58] Field of Search .......................... 29/836, 830, 852; 174/264; 361/414; 156/308.2, 309.6, 245

[56] References Cited

U.S. PATENT DOCUMENTS

| | | |
|---|---|---|
| 4,802,061 | 1/1989 | Portugall et al. . |
| 4,963,428 | 10/1990 | Harvey et al. .......................... 428/220 |
| 5,046,238 | 9/1991 | Daigle et al. ............................ 29/830 |

FOREIGN PATENT DOCUMENTS

| | | |
|---|---|---|
| 0254948 | 7/1987 | European Pat. Off. . |
| 0461378 | 4/1991 | European Pat. Off. . |

*Primary Examiner*—David P. Bryant
*Attorney, Agent, or Firm*—Whitham, Curtis, Whitham & McGinn; Ira D. Blecker

[57] ABSTRACT

A multilayer microelectronics module formed by laminating together individual thermoplastic polymer sheets formed by injection, compression or other suitable molding techniques. Metal pieces to form vias of a desired shape and size are inserted into the molded sheets, preferably by in situ insert molding. The vias provide an electrical connection from the top to the bottom surfaces of the sheets.

7 Claims, 3 Drawing Sheets

MULTILAYER MICROELECTRONIC WIRING MODULE AND METHOD FOR FORMING THE SAME

This application is a divisional of co-pending application Ser. No. 07/863,627, filed on Apr. 3, 1992, now issued as U.S. Pat. No. 5,259,110.

BACKGROUND OF THE INVENTION

1. Field of the Invention

This invention relates to a multilayer microelectronics module, and more particularly an inexpensive module formed by joining together thermoplastic polymer layers with conductive vias formed therein. A preferred embodiment of the invention has thermoplastic liquid crystal polymer layers.

2. Description of the Prior Art

Multilayer ceramic modules are well known and commonly used in the electronics industry to provide conducting paths among various components mounted on the module. While generally satisfactory in operation, such prior art ceramic-based modules experience problems; for example, shrinkage associated with the sintering step in the manufacture of a ceramic module. Shrinkage leads to some dimensional unpredictability and to stress of solid vias and circuit patterns.

Various proposals, as alternatives to the ceramic microelectronics module, have been made in the prior art, but these proposals have not gained widespread commercial acceptance.

SUMMARY OF THE INVENTION

An object of this invention is the provision of a multilayer microelectronics module that is relatively inexpensive to produce a module that at the same time has advantageous electrical and mechanical properties when compared with prior art ceramic modules.

Briefly, this invention contemplates the provision of a multilayer microelectronics module formed by joining together individual thermoplastic polymer sheets formed by injection, compression or other suitable molding techniques. Metal pieces to form vias of a desired shape and size are positioned in the molded sheets, preferably by an in situ insert molding process. The vias provide an electrical connection from the top to the bottom surfaces of the sheets. The vias can be made of a soft metal capable of being electrically and mechanically joined by compression bonding process. Alternatively, a metal core insert of a harder metal can be coated, prior to insertion in the laminate, with a metal such as soft gold, for compression bonding, or a low melting solder for reflow solder joining.

A conductive wiring pattern is formed on a surface of the laminate with the vias in place. The pattern may be formed by a suitable process such as a plating, evaporation, sputtering, or decal process. For conductive patterns formed by a decal process, a precoated via metal, such as a via coated with soft gold is used, and joined to the conductive pattern by pressure and heat. When the conductive pattern is joined by plating, evaporation, or sputtering, the pattern is advantageously electrically and mechanically joined to the vias as the pattern is formed.

The individual polymer sheets, with the desired wiring patterns and vias, are then stacked and aligned. Next they are joined together. In a laminating process, they are simultaneously compressed and heated in a conventional process step to laminate together the thermoplastic polymer sheets. The thermoplastic characteristic of the polymer material causes the sheets to cohesively bond together, providing mechanical integrity to the package.

An inter-layer thermoplastic coating can also be used to bond layers, such as a polyimide or liquid crystal polymer coating. The pressure or heat, or combination of pressure and heat in a lamination step, joins aligned via pieces in various layers, forming electrically conductive paths in the module.

In one specific embodiment of the invention, thermoplastic liquid crystal polymer sheets or thermoplastic liquid crystal polymer composite sheets are used. The liquid crystal polymer (hereinafter LCP) sheets can be molded, extruded, or calendared to create multi-directional flow patterns in the sheets in order to provide a generally isotropic module. Also, sheets with unidirectional flow patterns can be stacked in layers, with flow patterns in successive layers orientated in different directions, to provide a module with generally isotropic characteristics. These approaches also may be used in combination.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
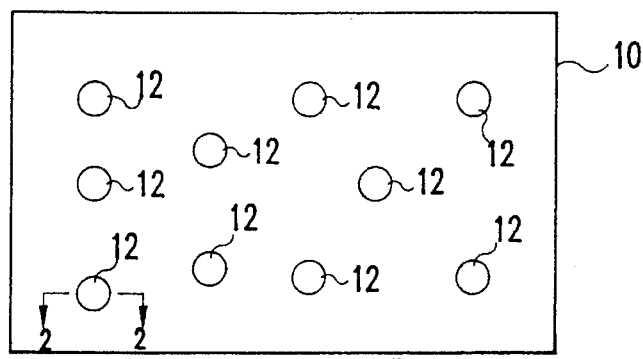
FIG. 1 is a plan view of a molded thermoplastic polymer sheet with via metallization.
Figure 2:
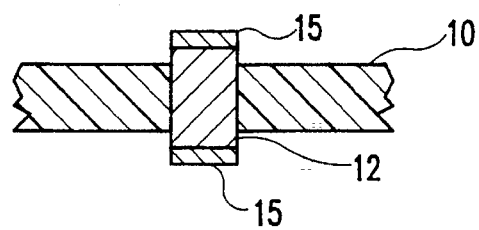
FIG. 2 is a fragmentary sectional view along the line 2—2 of FIG. 1.

Referring now to FIGS. 1 and 2 of the drawings, individual thermoplastic polymer sheets 10 may be fabricated by any of a number of suitable methods known in the art, such as injection, compression or other molding techniques. Suitable materials from which the sheets 10 may be made include a number of known thermoplastic polymers and thermoplastic polymers and fillers in combination, selected to provide desired electrical and mechanical properties. Such thermoplastic polymers include: thermoplastic liquid crystal polymer; polyketone; polyimide; polypheneylene sulfide; polyphenyleneoxide; polyethersulfane; polyetherimide; polyetherketone; polyetheretherketone; and polyarylsulfone. Such fillers include glass, ceramics and talcs. As will be discussed in more detail hereinafter, thermoplastic liquid crystal polymers are particularly advantageous in this application; such liquid crystal polymers are commercially available from various sources, including but not limited to AMOCO Corporation and Hoechst Celanese Corporation.

Via conductors 12 (preferably solid metal conductors) are disposed in sheets 10 in order to provide a means of electrical connection between the upper and lower surfaces of the sheets. The vias 12 are metal pieces of a desired shape and size and may be inserted into a sheet 10, as disclosed in copending applications Ser. No. 07/863,645, filed Apr. 3, 1992, to Arthur Bross et al., entitled "Method of Forming Vias and Pads in Thermoplastic Substrates", (Attorney Docket No. FI9-91-147) and Ser. No. 07/863,643, filed Apr. 3, 1992, to Arthur Bross et al., entitled "High Density Connector System and Method of Manufacture", (Attorney Docket No. FI9-91-126) both assigned to the same assignee as this application and filed concurrently herewith. Alternatively, the via inserts 12 may be molded into sheet 10 in situ during the molding process.

The vias 12 can be made of a soft metal, such as copper or copper alloy, capable of being bonded to a mating conductor by compression bonding. Alternately, the metal piece that forms the conductor of the via can be coated with a joinable metal 15, such as soft gold, for compression bonding, or a low melting solder for reflow solder joining. With such coatings, the vias can be electrically and mechanically joined to a wiring pattern and to each other after the sheets have been stacked and aligned.

The vias join to the conductive patterns during formation process of the pattern in the case of plated, evaporated, or sputtered patterns. For patterns formed by a decal process it is advantageous to use a precoated via metal as described above, and join the pattern to the via in a step subsequent to forming the pattern, such as compression bonding or reflow soldering. It should be noted that the above described molding techniques can also be used for molded-in-place items other than vias; for example, heat sinks, surface mount connectors, standoffs, and input/output interconnections.

Figure 3:
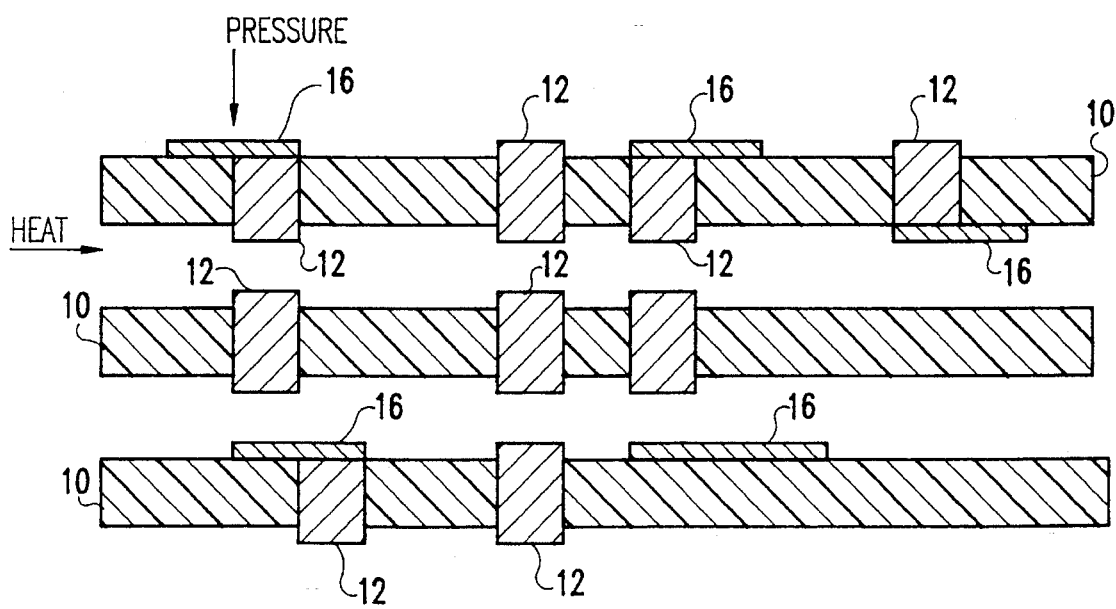
FIG. 3 is a side sectional view of a number of polymer sheets stacked and aligned prior to being laminated together.

Referring now to FIG. 3, as mentioned above, conductive patterns 16 (e.g., wiring patterns and distribution planes) can be added to the layers 10 with the vias 12 in place. There are a number of suitable processes in the art for forming the conductive patterns; for example, plating, lift-off, subtractive etching of blanket metal layers, and the placement of preformed decal layers are all potentially suitable processes, depending upon the particular application. The metal or alloy chosen for the pattern should be compatible with the via metal.

Figure 4:
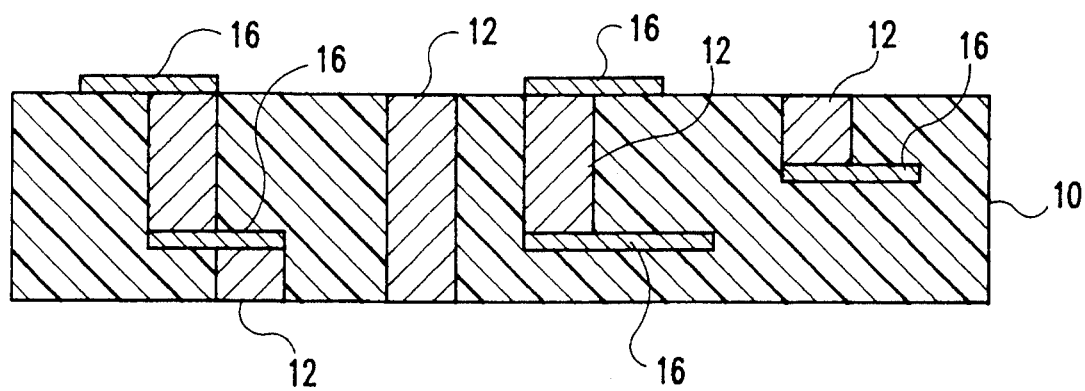
FIG. 4 is a sectional view of the polymer sheets of FIG. 3 laminated to form a module in accordance with the teachings of this invention.

The final package fabrication requires the stacking and aligning of the individual sheets 10. A thermal compression step involves the simultaneous application of heat and pressure to the stack, as in conventional lamination processing. During the thermal compression step, the thermoplastic characteristics of the polymer, including a thermoplastic organic coating on the sheets such as polyimide or LCP coating, or mixtures thereof, cause the sheets to cohesively or adhesively bond together, providing a module with mechanical integrity. Pressure, heat, or combination of pressure and heat mechanically and electrically join together via pieces that are aligned with one another on adjacent sheets and form electrically conductive paths inside the module, as shown in FIG. 4.

Multilayer microelectronic substrates comprised of laminated thermoplastic liquid crystal polymer sheets are particularly attractive because of certain desirable characteristics of liquid crystal polymers for electronic applications. Isotropic modules can be formed by means of the following techniques despite the inherent anisotropy of liquid crystal polymers.

Figure 5:
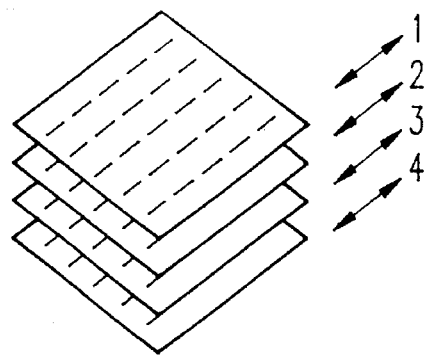
FIG. 5 is a perspective view of thermoplastic liquid crystal polymer sheets.

FIG. 5 illustrates four planes of a conventionally molded LCP piece where the mold gating was oriented in the flow direction; for example, gated through a static gate system, or an LCP film extruded through a static die opening. Typical of anisotropic materials, such as LCPs, the material has different properties in a direction across the flow direction as compared with properties in the flow direction. The arrows in the figures indicate flow direction.

Figure 6:
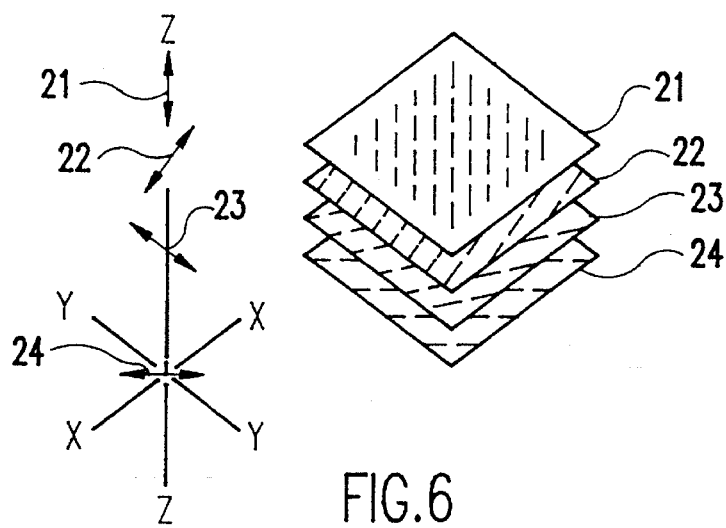
FIGS. 6 and 7 are perspective views similar to FIG. 5 of liquid crystal polymer sheets arranged to provide an isotropic module upon lamination of the sheets.

FIG. 6 illustrates an arrangement of LCP layers in accordance with this invention. The LCP flow orientation (indicated by arrows in the figure) is rotated from one layer to the other with respect to one another in a top-to-bottom (z) direction so that the flow orientation of a completed module is orientated along multiple axes. The flow orientation direction can be changed by imparting a shearing force to the LCP as it moves past opposing dynamic gates in a molding operation. The velocity of the gates, flow of material, and the solidification process influence the orientation. Thus with a material such as LCP's, which are fibril in nature, the fibrils can be oriented as shown by 21, 22, 23, and 24 of FIG. 6. The fibrils can be multiaxial rather than unidirectional and the process likewise can incorporate reinforcing and other fillers in a multi-oriented LCP.

Figure 7:
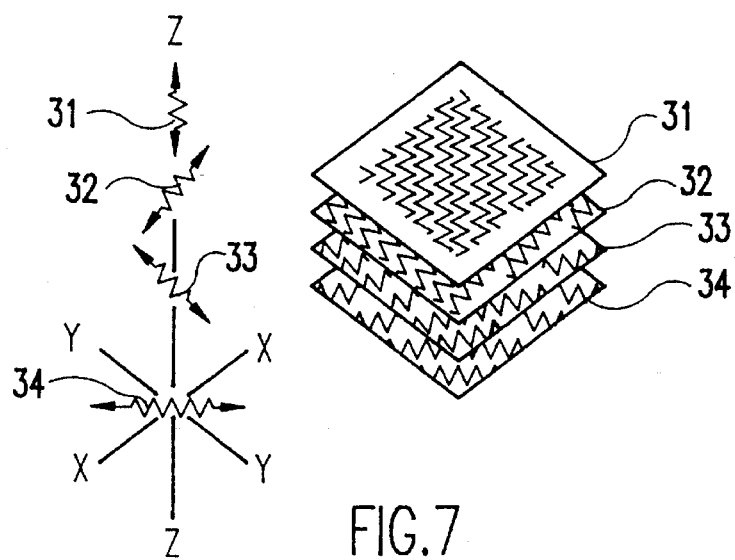

FIG. 7 illustrates a multiaxial herringbone flow pattern in each layer and a rotation of the LCP herringbone flow orientation from layer to layer. This herringbone orientation can be produced by a shear force imparted to the LCP as it moves past reciprocating, opposing dynamic gates in a molding operation. Here, reciprocating, opposing, dynamic die surfaces can be used to impart the desired orientation pattern to the LCP flow. Again, the velocity of the gates, flow of material, and the solidification process influence the orientation. Thus, with a material such as LCP's, which are fibril in nature, the fibrils can be oriented as shown by 31, 32, 33, and 34.

LCP sheets, such as those shown in FIGS. 6 and 7, can be formed into wiring modules in the manner described in connection with FIGS. 1 through 4. In addition, conductive needles, tubes, spheres, paste, plated and evaporated vias and other prior art techniques, as well as those described above, can be used to provide circuit metallurgy.

Multiaxial layers, whether inherent in each layer, or cross-layered, coupled with a combining layering process, improve properties and make the integral module act more isotropic. Properties such as CTE, modulus, tensile, impact, shrinkage, etc., when taken across any given line through the module, is a combination of the average flow, and cross-flow properties.

LCP's provide high circuit and via density for single, or multi-chip substrate modules, with properties not available in ceramic substrates. They can be injection and compression molded as well as extruded and calendared. They can be assembled and joined using lamination, adhesives, films, and alloying techniques.

LCP's can be filled, reinforced or alloyed, to customize other properties thereby improving thermal conduction, lamination, surface finish, and other customized needs. They can be post machined, formed, metallized by plating, evaporation, paste screening, punched, laser drilled and/or machined. They do not require sintering as with ceramics, hence there is negligible shrink and/or stresses associated in the layering and lamination process to integrate all the components. LCPs are hydrophobic, unlike polyimides, and have little to no ionics to endanger devices and metallurgy. Semiconductor chips can be attached by wire bonding, flip chip, adhesives, reflow, and other known chip attach methodology.

Although only a small portion of substrate is shown, it is obvious that this technique can be used for larger substrates.

It will be apparent to those skilled in the art that the foregoing embodiments are exemplary only, and that the principles of applicants' invention can be incorporated in other embodiments.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method for forming a multilayer microelectronic wiring module, comprising the steps of:

forming a plurality of thermoplastic polymer sheets;

inserting a plurality of metal pieces into each of said plurality of thermoplastic polymer sheets to form vias therein;

forming a conductive wiring pattern on at least certain ones of said plurality of thermoplastic polymer sheets;

stacking said plurality of thermoplastic polymer sheets with said vias in at least certain sheets aligned with vias in an adjacent sheet; and applying heat or pressure or both heat and pressure to said stacked thermoplastic polymersheets to bond said sheets to form a microelctronic wiring module.

2. A method for forming a multilayer microelectronic wiring module as in claim 1, wherein said thermoplastic polymer sheets comprise a thermoplastic liquid crystal polymer.

3. A method for forming a multilayer microelectronic wiring module as in claim 2, wherein said thermoplastic liquid crystal polymer in each sheet has a flow direction along an axis and the flow directions in two adjacent sheets are aligned along different axes.

4. A method for forming a multilayer microelectronic wiring module as in claim 1, wherein aligned vias are bonded together by compression bonding.

5. A method for forming a multilayer microelectronic wiring module as in claim 1, wherein said aligned vias are bonded together by reflow soldering.

6. A multilayer microelectronic wiring module comprising in combination:

a plurality of thermoplastic polymer sheets having conductive vias embedded therein and comprising a thermoplastic liquid crystal polymer, said thermoplastic, liquid crystal polymer in each sheet having an irregular pattern of flow in a direction along an axis;

at least certain ones of said plurality of thermoplastic polymer sheets having a wiring pattern formed on a surface thereof;

said plurality of thermoplastic polymer sheets being bonded together by an application of heat or pressure or both heat and pressure to form a wiring module with certain of said conductive vias in one thermoplastic polymer sheet joined to certain of said conductive vias in an adjacent thermoplastic polymer sheet.

7. A multilayer electronic wiring module comprising in combination:

plurality of molded thermoplastic polymer sheets having conductive vias molded in situ in each sheet and comprising a thermoplastic liquid crystal polymer, said thermoplastic liquid crystal polymer in each sheet having an irregular pattern of flow in a direction along an axis;

at least some of said plurality of thermoplastic polymer sheets having a wiring pattern formed on a surface thereof;

said plurality of thermoplastic polymer sheets being bonded together by an application of heat or pressure or both heat and pressure to form a wiring module with certain of said conductive vias in one sheet joined to certain of said conductive vias in an adjacent sheet.

* * * * *